(12) United States Patent
Liu

(10) Patent No.: US 10,561,042 B2
(45) Date of Patent: Feb. 11, 2020

(54) FLUID GUIDING COVER

(71) Applicant: Wistron Corporation, New Taipei (TW)

(72) Inventor: Chia-Hsin Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 593 days.

(21) Appl. No.: 15/389,448

(22) Filed: Dec. 23, 2016

(65) Prior Publication Data
US 2018/0110156 A1 Apr. 19, 2018

(30) Foreign Application Priority Data

Oct. 14, 2016 (TW) .............................. 105133234 A

(51) Int. Cl.
*H05K 5/03* (2006.01)
*H05K 7/20* (2006.01)
(52) U.S. Cl.
CPC .......... *H05K 7/20727* (2013.01); *H05K 5/03* (2013.01); *H05K 7/20145* (2013.01)
(58) Field of Classification Search
CPC .. H05K 7/20727; H05K 5/03; H05K 7/20145; H05K 7/20618
USPC ........................................ 454/184; 137/115.2
See application file for complete search history.

(56) References Cited

U.S. PATENT DOCUMENTS

| 6,710,240 | B1 * | 3/2004 | Chen .................. | H05K 7/20145 174/135 |
|---|---|---|---|---|
| 7,542,289 | B2 | 6/2009 | Tsai et al. | |
| 8,353,746 | B2 | 1/2013 | Tsai et al. | |
| 2009/0034190 | A1 | 2/2009 | Tsai et al. | |
| 2010/0105313 | A1 | 4/2010 | Tsai et al. | |
| 2014/0110089 | A1 | 4/2014 | Lin | |

FOREIGN PATENT DOCUMENTS

| CN | 201097302 | 8/2008 |
| CN | 201336015 | 10/2009 |
| TW | M461290 | 9/2013 |
| TW | 201417691 | 5/2014 |

OTHER PUBLICATIONS

"Office Action of China Counterpart Application," dated Apr. 24, 2019, p. 1-p. 7.
"Office Action of Taiwan Counterpart Application," dated Jun. 15, 2017, p. 1-p. 5, with English translation thereof.

* cited by examiner

*Primary Examiner* — Grant Moubry
*Assistant Examiner* — Ryan L Faulkner
(74) *Attorney, Agent, or Firm* — JCIPRNET

(57) ABSTRACT

A fluid guiding cover is adapted to be assembled to a casing. The fluid guiding cover includes a first plate, a second plate, and a third plate. The first plate has a main body portion and a sidewall portion, wherein the main body portion is detachably fixed on the casing and stretches over a channel of the casing. The sidewall portion is connected to the main body portion and located in the channel. The second plate is rotatably disposed on one side of the sidewall portion, wherein the second plate is located in the channel and configured to abut against or separate from a bottom surface of the casing. The third plate is rotatably disposed on one side of the sidewall portion and disposed in parallel with the second plate, wherein the third plate is located in the channel and configured to abut against or separate from the bottom surface.

13 Claims, 10 Drawing Sheets

FLUID GUIDING COVER

CROSS-REFERENCE TO RELATED APPLICATION

This application claims the priority benefit of Taiwan application serial no. 105133234, filed on Oct. 14, 2016. The entirety of the above-mentioned patent application is hereby incorporated by reference herein and made a part of this specification.

BACKGROUND OF THE INVENTION

Field of the Invention

The invention relates to a fluid guiding cover, particularly to a fluid guiding cover suitable for a server.

Description of Related Art

A typical server includes a casing, a circuit board, an expansion card and an electronic device, wherein the circuit board is fixed inside the casing and has at least one connection port disposed thereon. The expansion card is inserted into the connection port to be electrically connected to the circuit board. Common expansion cards include PCIe cards or graphics chips, which have various different sizes. Generally, in most cases, the connection port is arranged in a channel of the casing. After the expansion card is inserted into the port, an outer cover is fixed above the channel so as to cover the expansion card. The outer cover has an opening corresponding to the outline and size of the expansion card inserted into the port. Accordingly, after the outer cover is fixed above the channel, an inner edge of the opening abuts against an outer surface of the expansion card.

After the outer cover is fixed above the channel and has covered the expansion card, a gap is left only between the outer cover and the casing for allowing an airflow to pass therethrough, so that cold air flows from one side of the outer cover through the gap into between the outer cover and the expansion card. At this moment, the cold air is heat-exchanged with the expansion card in operation to be converted into hot air, wherein the hot air flows out from another side of the outer cover, so as to dissipate heat generated during operation of the expansion card to the outside. That is, the disposition of the outer cover is helpful in improving heat dissipation efficiency of the server. However, since expansion cards of different sizes require corresponding outer covers, when a user wants to replace an expansion card of one size with an expansion card of another size, the user has to replace the outer cover as well, which is quite inconvenient. On the other hand, from a manufacturer's point of view, since the manufacturer needs to produce corresponding outer covers for expansion cards of various sizes, manufacturing cost can hardly be reduced, and management and selling are hindered.

SUMMARY OF THE INVENTION

The invention provides a fluid guiding cover having good scalability.

The fluid guiding cover according to the invention is adapted to be assembled to a casing. The fluid guiding cover includes a first plate, a second plate, and a third plate. The first plate has a main body portion and a sidewall portion, wherein the main body portion is detachably fixed on the casing and stretches over a channel of the casing. The sidewall portion is connected to the main body portion and located in the channel. The second plate is rotatably disposed on one side of the sidewall portion, wherein the second plate is located in the channel and configured to abut against or separate from a bottom surface of the casing. The third plate is rotatably disposed on one side of the sidewall portion and is disposed in parallel with the second plate, wherein the third plate is located in the channel and configured to abut against or separate from the bottom surface.

In one embodiment of the invention, the fluid guiding cover further includes a fourth plate. The fourth plate is rotatably connected to the sidewall portion and is located in the channel. The second plate is rotatably connected to the fourth plate, and the third plate is rotatably connected to the fourth plate.

In one embodiment of the invention, the fourth plate is located between the second plate and the sidewall portion and between the third plate and the sidewall portion.

In one embodiment of the invention, the second plate and the third plate are respectively located between the fourth plate and the bottom surface.

In one embodiment of the invention, the fourth plate is perpendicular to the main body portion.

In one embodiment of the invention, the second plate has a first engagement structure, and the fourth plate has a second engagement structure disposed corresponding to the first engagement structure. When the second plate is rotated relative to the fourth plate to make the second plate and the fourth plate overlap with each other, the second plate and the fourth plate are perpendicular to the main body portion, the first engagement structure and the second engagement structure are engaged with each other, and the third plate and the fourth plate define a first opening.

In one embodiment of the invention, the third plate has a third engagement structure, and the fourth plate further has a fourth engagement structure disposed corresponding to the third engagement structure. When the third plate is rotated relative to the fourth plate to make the third plate and the fourth plate overlap with each other, the third plate and the fourth plate are perpendicular to the main body portion, the third engagement structure and the fourth engagement structure are engaged with each other, and the sidewall portion and the fourth plate define a second opening.

In one embodiment of the invention, an area of the second opening is larger than an area of the first opening.

In one embodiment of the invention, the fourth plate further has a fifth engagement structure. The first plate further has an extension portion. The extension portion is connected to the main body portion and the sidewall portion, and is located on one side of the fourth plate. The extension portion has a sixth engagement structure disposed corresponding to the fifth engagement structure. When the fourth plate is rotated relative to the sidewall portion to make the second plate, the third plate and the fourth plate parallel to the main body portion, the fifth engagement structure and the sixth engagement structure are engaged with each other, and the sidewall portion defines a third opening.

In one embodiment of the invention, the third opening has a larger area than the second opening.

In one embodiment of the invention, the extension portion is perpendicular to the main body portion, and the third plate is located between the extension portion and the second plate.

In one embodiment of the invention, the fifth engagement structure includes a positioning protrusion, and the sixth engagement structure includes a positioning hole.

In one embodiment of the invention, the sidewall portion, the second plate and the third plate are respectively perpendicular to the main body portion.

Based on the above, the fluid guiding cover according to the invention includes at least two movable plates. Thus, by expanding or folding the two plates, the fluid guiding cover can be fitted with the channel of the casing or expansion cards of at least two different sizes located in the channel of the casing. Therefore, the fluid guiding cover according to the invention has good scalability and is quite easy for a user to operate. On the other hand, from a manufacturer's point of view, since the manufacturer may produce a modular fluid guiding cover corresponding to expansion cards of at least two different sizes, the manufacturing cost is reduced, and management and selling are facilitated.

To make the above features and advantages of the invention more comprehensible, several embodiments accompanied with drawings are described in detail as follows.

DETAILED DESCRIPTION OF DISCLOSED EMBODIMENTS

Figure 1A:
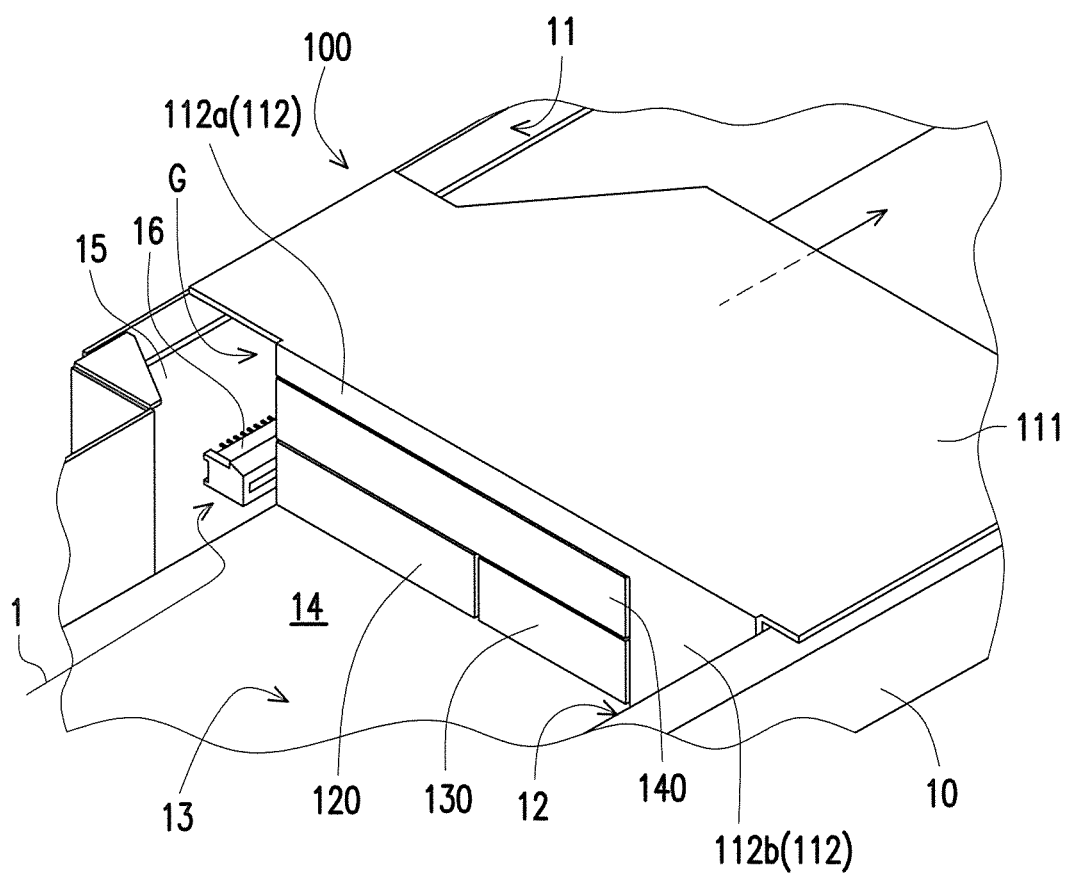
FIG. 1A is a schematic view of assembling a fluid guiding cover to a casing according to one embodiment of the invention.
Figure 1B:
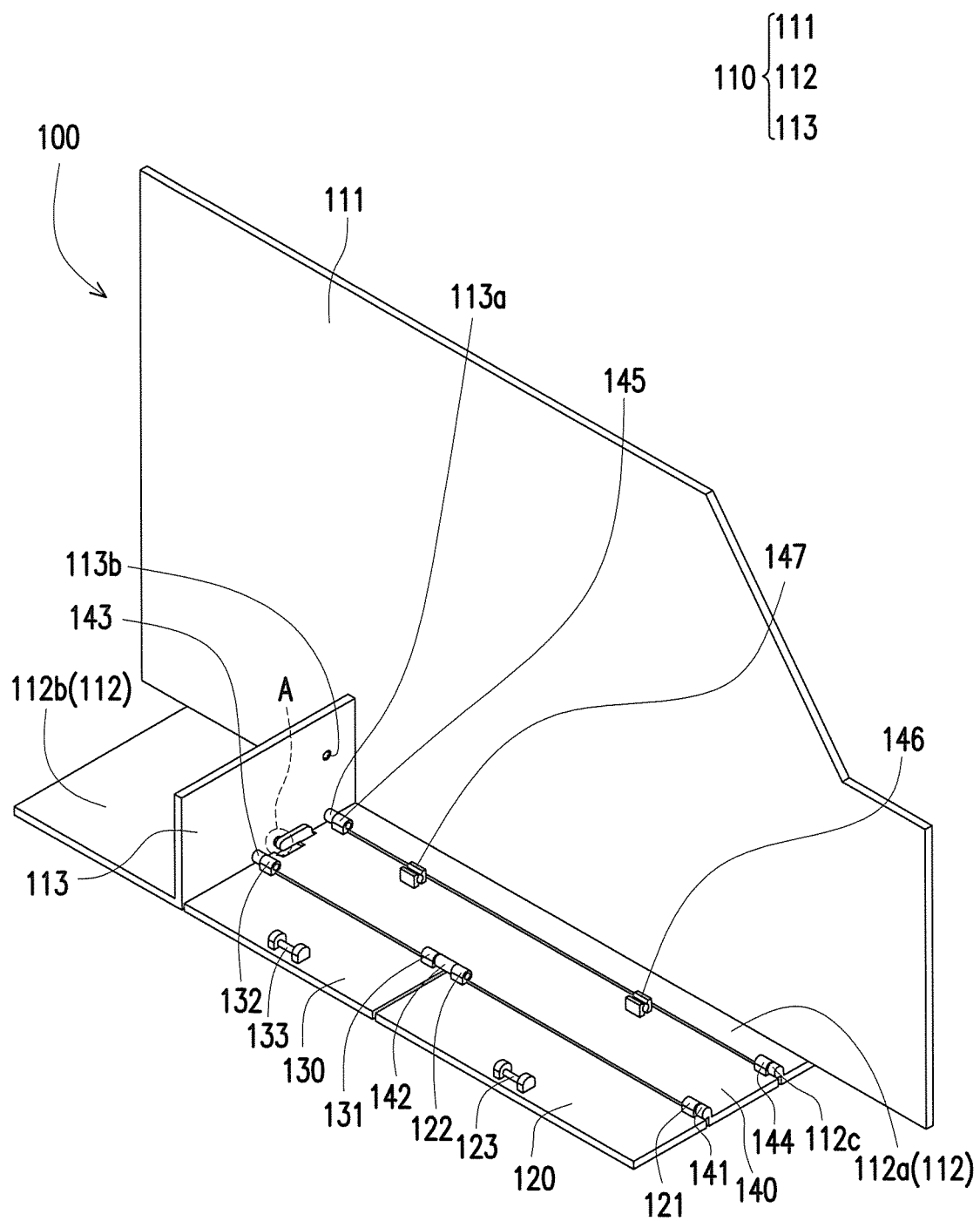
FIG. 1B is a schematic view of the fluid guiding cover in FIG. 1A from another viewing angle.

FIG. 1A is a schematic view of assembling a fluid guiding cover to a casing according to one embodiment of the invention. FIG. 1B is a schematic view of the fluid guiding cover in FIG. 1A from another viewing angle. Referring to FIGS. 1A and 1B, in the present embodiment, a casing 10 is a portion of an outer casing of a server, wherein a first inner wall surface 11, a second inner wall surface 12 opposite to the first inner wall surface 11 and a bottom surface 13 connected to the first inner wall surface 11 and to the second inner wall surface 12 define a channel 14 that allows an airflow 1 to pass therethrough, and an arrow indicates a flowing direction of the airflow 1 in the channel 14. On the other hand, a circuit board 15 is disposed on the first inner wall surface 11 of the casing 10, and a connection port 16 is disposed on the circuit board 15 and electrically connected to the circuit board 15. The connection port 16 is located in the channel 14 and allows an expansion card to be inserted thereinto, so as to electrically connect the expansion card to the circuit board 15.

A fluid guiding cover 100 is adapted to be assembled to the casing 10, wherein the fluid guiding cover 100 includes a first plate 110, a second plate 120 and a third plate 130, and the second plate 120 and the third plate 130 are rotatably disposed on one side of the first plate 110. In detail, the first plate 110 has a main body portion 111 and a sidewall portion 112, wherein the main body portion 111 is detachably fixed on the casing 10 and stretches over the channel 14 of the casing 10. The sidewall portion 112 is perpendicularly connected to the main body portion 111 and is located in the channel 14. That is, the sidewall portion 112 is located between the bottom surface 13 of the casing 10 and the main body portion 111.

The second plate 120 is rotatably disposed on one side of the sidewall portion 112, wherein the second plate 120 is located in the channel 14 and abuts against the bottom surface 13 of the casing 10. On the other hand, the third plate 130 is rotatably disposed on one side of the sidewall portion 112 and is disposed in parallel with the second plate 120, wherein the third plate 130 is located in the channel 14 and abuts against the bottom surface 13 of the casing 10. As shown in FIG. 1A, the sidewall portion 112, the second plate 120 and the third plate 130 are respectively perpendicular to the main body portion 111 and are coplanar. The second plate 120 and the third plate 130 are located between the sidewall portion 112 and the bottom surface 13 of the casing 10, and the second plate 120 is located between the connection port 16 and the third plate 130. In the present embodiment, the sidewall portion 112 is divided into a first part 112a and a second part 112b, the first part 112a being located above the bottom surface 13 and does not abut against the bottom surface 13 of the casing 10, and the second part 112b abutting against the bottom surface 13 of the casing 10, wherein the first part 112a has a side edge relatively close to the connection port 16, the second plate 120 has a side edge relatively close to the connection port 16, and the side edge of the first part 112a is, for example, aligned with the side edge of the second plate 120. The side edge of the first part 112a and the side edge of the second plate 120 maintain a gap G with respect to the first inner wall surface 11. On the other hand, the second part 112b abuts against the second inner wall surface 12 and the bottom surface 13 of the casing 10. Thus, the airflow 1 that passes through the channel 14 is obstructed by the sidewall portion 112, the second plate 120 and the third plate 130, and thus flows from one side of the fluid guiding cover 100 through the gap G into between the main body portion 111 and the bottom surface 13 of the casing 10, and flows out from another side of the fluid guiding cover 100.

Continuing to refer to FIGS. 1A and 1B, the fluid guiding cover 100 further includes a fourth plate 140, wherein the fourth plate 140 is rotatably connected to the sidewall portion 112 and is located in the channel 14. The second plate 120 is rotatably connected to the fourth plate 140, and the third plate 130 is rotatably connected to the fourth plate 140. In detail, the fourth plate 140 is perpendicular to the main body portion 111, and the sidewall portion 112, the second plate 120, the third plate 130 and the fourth plate 140 are coplanar. The fourth plate 140 is located between the second plate 120 and the first part 112a of the sidewall portion 112, and also between the third plate 130 and the first part 112a of the sidewall portion 112. That is, the second plate 120 is indirectly connected to the sidewall portion 112 through the fourth plate 140, and the third plate 130 is indirectly connected to the sidewall portion 112 through the fourth plate 140. Moreover, the second plate 120 and the third plate 130 are respectively located between the fourth plate 140 and the bottom surface 13 of the casing 10. The fourth plate 140 has a side edge parallel to the bottom surface 13 of the casing 10, the second plate 120 has a side edge parallel to the bottom surface 13 of the casing 10, and the third plate 130 has a side edge parallel to the bottom surface 13 of the casing 10. Moreover, a length of the side edge of the fourth plate 140 is equal to a sum of lengths of the side edge of the second plate 120 and the side edge of the third plate 130.

In the present embodiment, the first plate 110 further has an extension portion 113, wherein the extension portion 113 is perpendicularly connected to the main body portion 111 and the sidewall portion 112, and is located between the first part 112a and the second part 112b of the sidewall portion 112. The fourth plate 140 is rotatably connected to the first part 112a of the sidewall portion 112, and the extension portion 113 is located on the same side as the fourth plate 140 and the third plate 130. The second plate 120 has at least one first pivoting structure (two first pivoting structures 121 and 122 are schematically illustrated), the third plate 130 has at least one second pivoting structure (two second pivoting structures 131 and 132 are schematically illustrated), and the fourth plate 140 has at least two third pivoting structures (three third pivoting structures 141, 142 and 143 are schematically illustrated). The first pivoting structures 121 and 122 are respectively pivoted to the third pivoting structures 141 and 142, thereby enabling the second plate 120 to be rotated relative to the fourth plate 140. The second pivoting structures 131 and 132 are respectively pivoted to the third pivoting structures 142 and 143, thereby enabling the third plate 130 to be rotated relative to the fourth plate 140. The third pivoting structure 142 is located between the third pivoting structures 141 and 143, and the first pivoting structure 121 and the second pivoting structure 131 are respectively pivoted to two opposing sides of the third pivoting structure 142.

On the other hand, the fourth plate 140 further has at least one fourth pivoting structure (two fourth pivoting structures 144 and 145 are schematically illustrated), wherein the fourth pivoting structure 144 and the third pivoting structure 141 are opposite to each other, the fourth pivoting structure 145 and the third pivoting structure 143 are opposite to each other, and the fourth pivoting structure 145 and the third pivoting structure 143 are closer to the extension portion 113 than the fourth pivoting structure 144 and the third pivoting structure 141. The first part 112a of the sidewall portion 112 has a fifth pivoting structure 112c disposed corresponding to the fourth pivoting structure 144, and the extension portion 113 has a sixth pivoting structure 113a disposed corresponding to the fourth pivoting structure 145. The fourth pivoting structure 144 is pivoted to the fifth pivoting structure 112c, and the fourth pivoting structure 145 is pivoted to the sixth pivoting structure 113a, thereby enabling the fourth plate 140 to be rotated relative to the sidewall portion 112 and the extension portion 113.

Figure 1C:
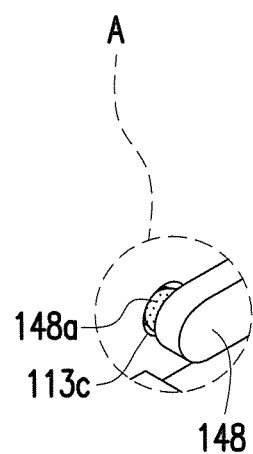
FIG. 1C is an enlarged schematic view of region A in FIG. 1B.

FIG. 1C is an enlarged schematic view of region A in FIG. 1B. Referring to FIGS. 1A to 1C, the second plate 120 further has a first engagement structure 123, and the fourth plate 140 has a second engagement structure 146 disposed corresponding to the first engagement structure 123. The third plate 130 further has a third engagement structure 133, and the fourth plate 140 further has a fourth engagement structure 147, disposed corresponding to the third engagement structure 133. On the other hand, the fourth plate 140 further has a fifth engagement structure 148, and the extension portion 113 further has a sixth engagement structure 113b and a seventh engagement structure 113c that are opposite to each other, wherein the sixth engagement structure 113b is closer to the main body portion 111 than the seventh engagement structure 113c. The fifth engagement structure 148 includes a positioning protrusion 148a, and the sixth engagement structure 113b and the seventh engagement structure 113c are, for example, positioning holes fitted with the positioning protrusion 148a. When the second plate 120 and the third plate 130 respectively abut against the bottom surface 13 of the casing 10, and the second plate 120, the third plate 130 and the fourth plate 140 are respectively perpendicular to the main body portion 111, the positioning protrusion 148a engages with the seventh engagement structure 113c, thereby preventing the fourth plate 140 from being rotated relative to the sidewall portion 112 and the extension portion 113.

Figure 2A:
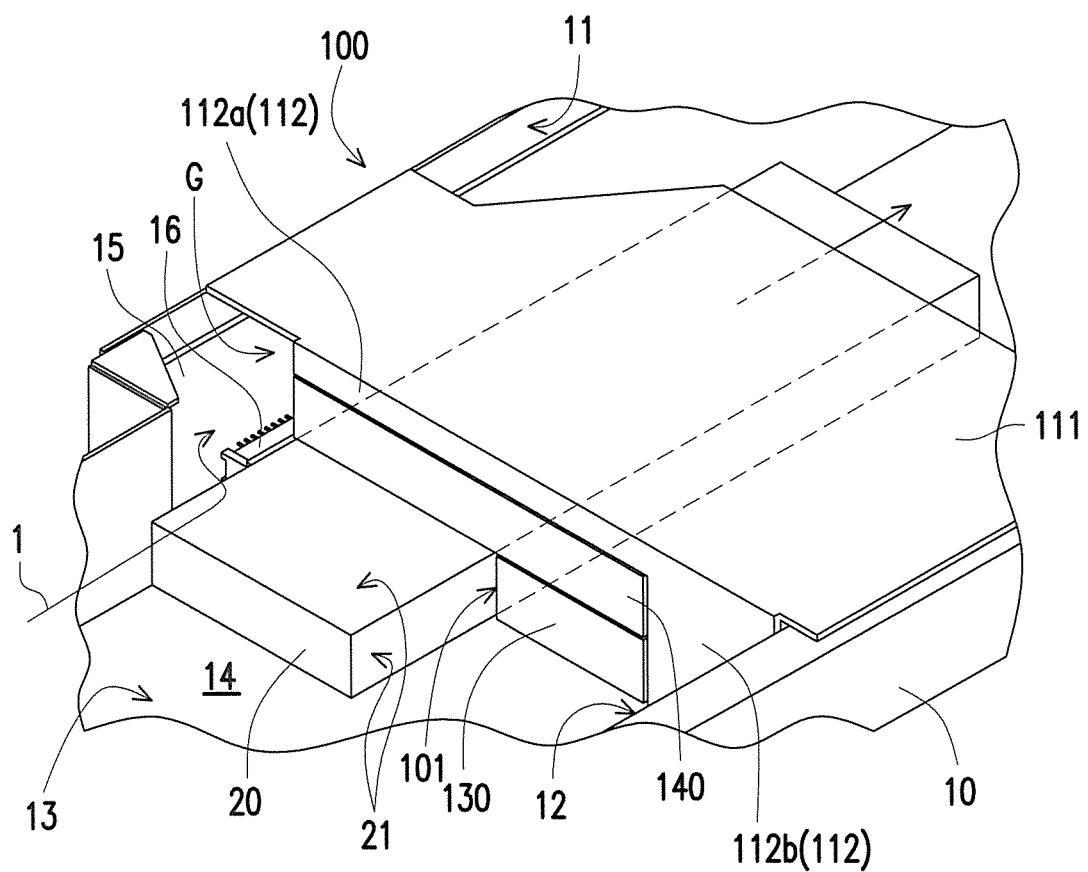
FIG. 2A is a schematic view showing that the fluid guiding cover in FIG. 1A is fitted with a first expansion card.
Figure 2B:
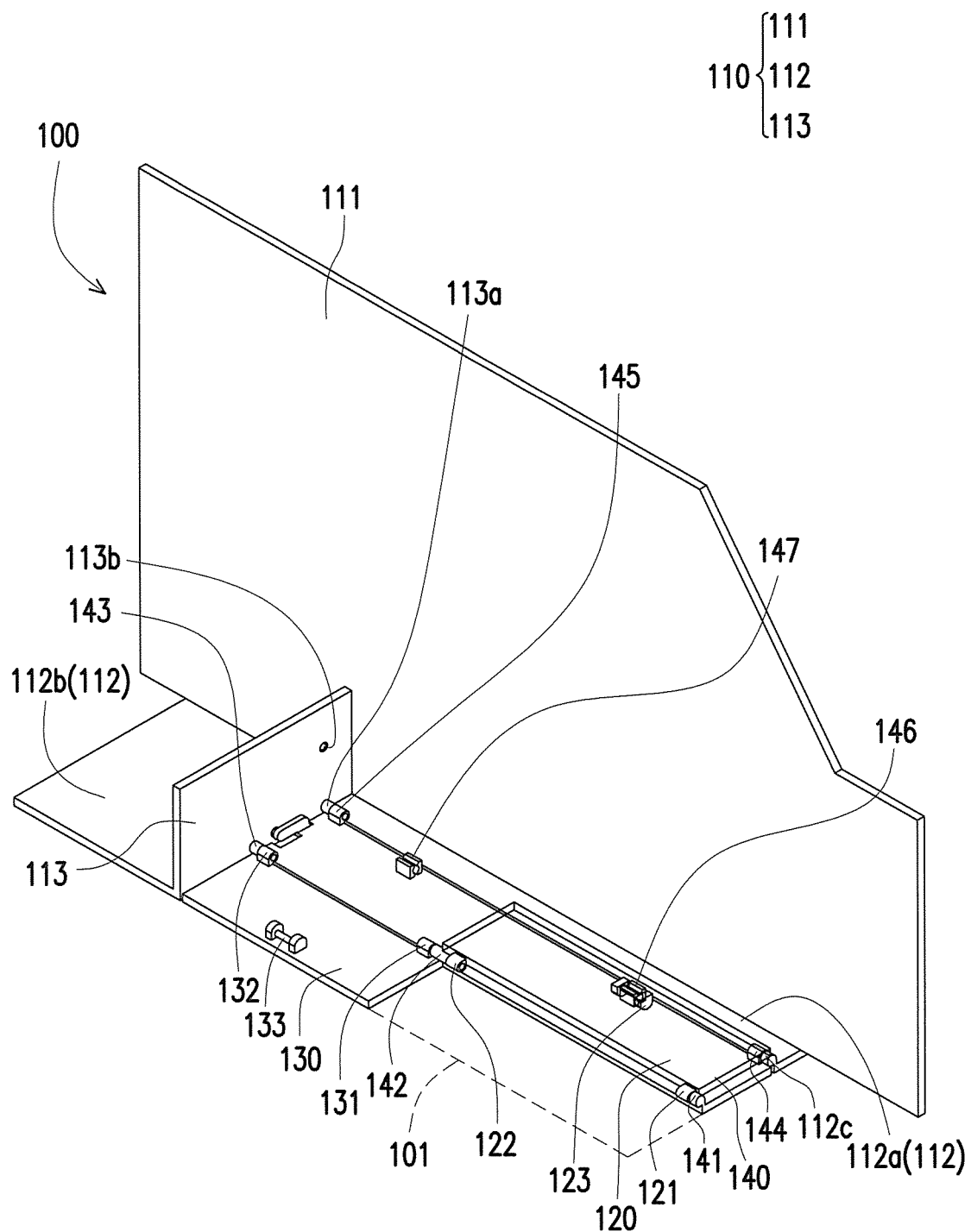
FIG. 2B is a schematic view of the fluid guiding cover in FIG. 2A from another viewing angle.

FIG. 2A is a schematic view showing that the fluid guiding cover in FIG. 1A is fitted with a first expansion card. FIG. 2B is a schematic view of the fluid guiding cover in FIG. 2A from another viewing angle. For clear illustration and ease of explanation, the second plate 120 in FIG. 2B is illustrated in a perspective manner. Following the above, referring to FIGS. 2A and 2B, a first expansion card 20 (e.g., LP PCIe card) is placed into the channel 14 so as to be inserted into the connection port 16 and to abut against the bottom surface 13 of the casing 10. Next, the second plate 120 is rotated relative to the fourth plate 140 so as to make the second plate 120 and the fourth plate 140 overlap with each other. At this moment, the second plate 120 and the fourth plate 140 overlapping with each other are respectively perpendicular to the main body portion 111. Moreover, the first engagement structure 123 and the second engagement structure 146 are engaged with each other, so that the second plate 120 is fixed to the fourth plate 140, and a first opening 101 is defined by the third plate 130 and the fourth plate 140.

Next, the first opening 101 is directed toward the channel 14, and the main body portion 111 is fixed on the casing 10. At this moment, the main body portion 111 stretches over the first expansion card 20, the second plate 120 separates from the bottom surface 13 of the casing 10 and is perpendicular to the main body portion 111, and the third plate 130 and the second part 112b of the sidewall portion 112 respectively abut against the bottom surface 13 of the casing 10. On the other hand, the first expansion card 20 has a cross section perpendicular to the bottom surface 13 of the casing 10, and an area of the cross section is substantially equal to an area of the first opening 101. Thus, after the main body portion 111 is fixed on the casing 10, the first expansion card 20 can be accommodated in the first opening 101, and the third plate 130 and the fourth plate 140 respectively abut against an outer surface 21 of the first expansion card 20, so that the fluid guiding cover 100 covers the first expansion card 20.

In this way, the airflow 1 that passes through the channel 14 is obstructed by the sidewall portion 112, the third plate 130 and the fourth plate 140, and thus flows from one side of the fluid guiding cover 100 through the gap G into between the main body portion 111 and the first expansion card 20, and flows out from another side of the fluid guiding cover 100. In detail, cold air that flows from one side of the fluid guiding cover 100 through the gap G into between the main body portion 111 and the first expansion card 20 is heat-exchanged with the first expansion card 20 in operation to be converted into hot air, wherein the hot air flows out from another side of the fluid guiding cover 100, so as to dissipate heat generated during operation of the first expansion card 20 to the outside. That is, the disposition of the fluid guiding cover 100 is helpful in improving heat dissipation efficiency of the server.

Figure 3A:
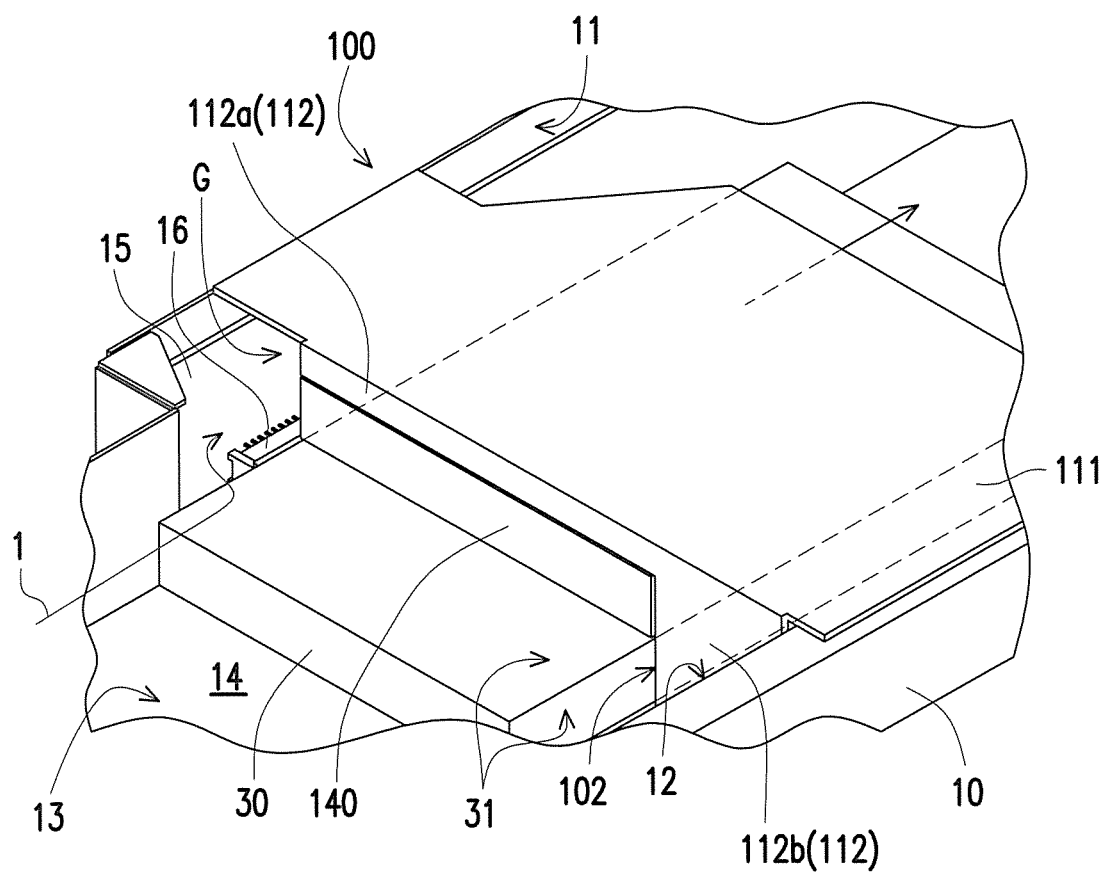
FIG. 3A is a schematic view showing that the fluid guiding cover in FIG. 1A is fitted with a second expansion card.
Figure 3B:
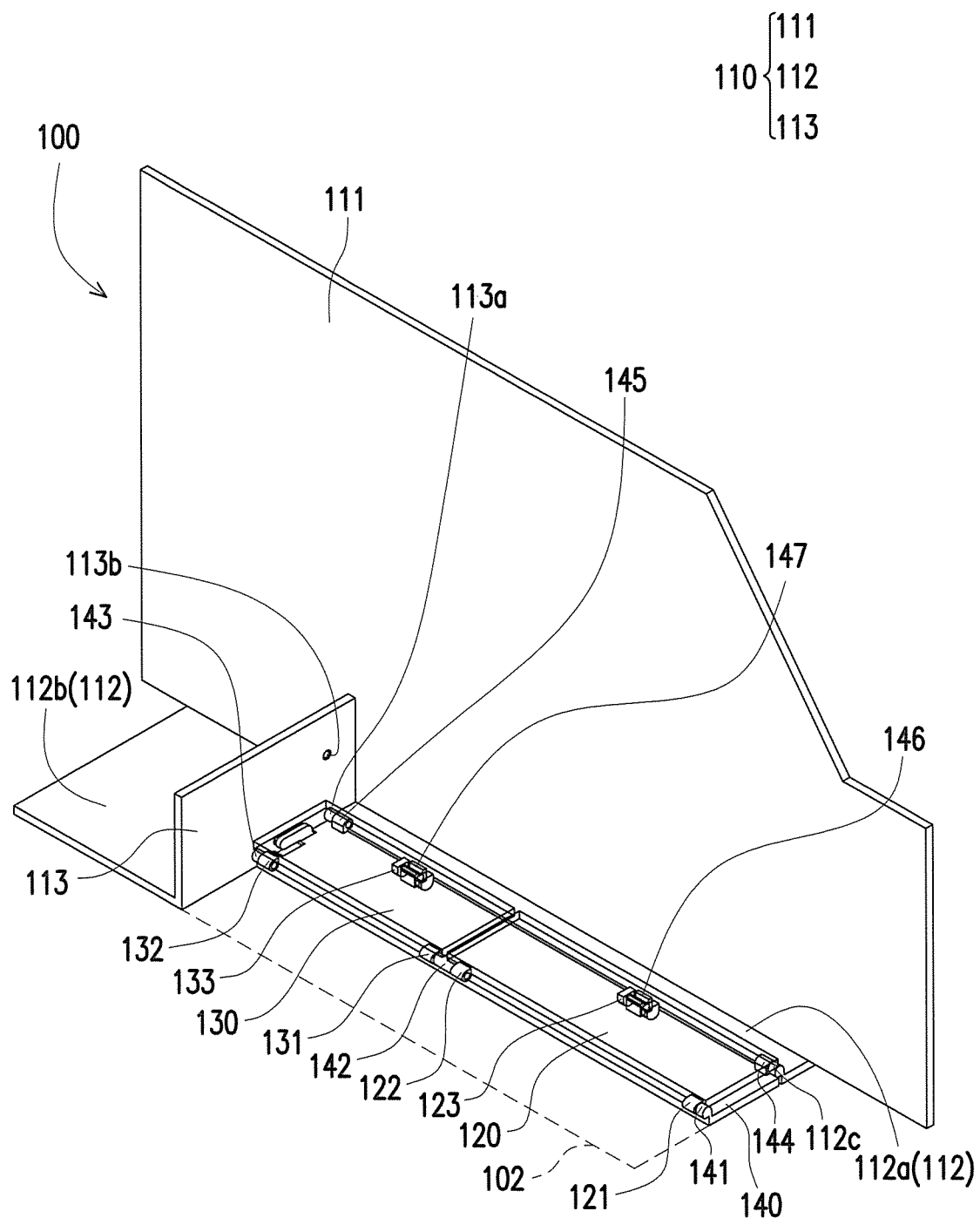
FIG. 3B is a schematic view of the fluid guiding cover in FIG. 3A from another viewing angle.

FIG. 3A is a schematic view showing that the fluid guiding cover in FIG. 1A is fitted with a second expansion card. FIG. 3B is a schematic view of the fluid guiding cover in FIG. 3A from another viewing angle. For clear illustration and ease of explanation, the second plate 120 in FIG. 3B is illustrated in a perspective manner. Following the above, referring to FIGS. 3A and 3B, a second expansion card 30 (e.g., single wide GPU card) has a larger size than the first expansion card 20 in FIG. 2A, wherein a width of the second expansion card 30 is larger than a width of the first expansion card 20, and a height of the second expansion card 30 is, for example, equal to a height of the first expansion card 20. Thus, after the second expansion card 30 is placed into the channel 14, inserted into the connection port 16 and has abutted against the bottom surface 13 of the casing 10, it is necessary to further rotate the third plate 130 relative to the fourth plate 140 so as to make the third plate 130 and the fourth plate 140 overlap with each other. At this moment, the third plate 130 and the fourth plate 140 overlapping with each other are respectively perpendicular to the main body portion 111. Moreover, the third engagement structure 133 and the fourth engagement structure 147 are engaged with each other, so that the third plate 130 is fixed to the fourth plate 140, and a second opening 102 is defined by the second part 112b of the sidewall portion 112 and the fourth plate 140, wherein an area of the second opening 102 is larger than an area of the first opening 101.

Next, the second opening 102 is directed toward the channel 14, and the main body portion 111 is fixed on the casing 10. At this moment, the main body portion 111 stretches over the second expansion card 30, the second plate 120 and the third plate 130 respectively separate from the bottom surface 13 of the casing 10 and are perpendicular to the main body portion 111, and the second part 112b of the sidewall portion 112 abuts against the bottom surface 13 of the casing 10. On the other hand, the second expansion card 30 has a cross section perpendicular to the bottom surface 13 of the casing 10, and an area if the cross section is substantially equal to an area of the second opening 102. Thus, after the main body portion 111 is fixed on the casing 10, the second expansion card 30 can be accommodated in the second opening 102, and the fourth plate 140 abuts against an outer surface 31 of the second expansion card 30, so that the fluid guiding cover 100 covers the second expansion card 30.

In this way, the airflow 1 that passes through the channel 14 is obstructed by the sidewall portion 112 and the fourth plate 140, and thus flows from one side of the fluid guiding cover 100 through the gap G into between the main body portion 111 and the second expansion card 30, and flows out from another side of the fluid guiding cover 100. In detail, cold air that flows from one side of the fluid guiding cover 100 through the gap G into between the main body portion 111 and the second expansion card 30 is heat-exchanged with the second expansion card 30 in operation to be converted into hot air, wherein the hot air flows out from another side of the fluid guiding cover 100, so as to dissipate heat generated during operation of the second expansion card 30 to the outside. That is, the disposition of the fluid guiding cover 100 is helpful in improving heat dissipation efficiency of the server.

In brief, since the fluid guiding cover 100 at least includes the second plate 120 and the third plate 130 that are movable, after the first expansion card 20 or the second expansion card 30 different in size from the first expansion card 20 is inserted into the connection port 16, the second plate 120 may be folded, or the second plate 120 and the third plate 130 may be respectively folded, so as to define the first opening 101 for accommodating the first expansion card 20 or the second opening 102 for accommodating the second expansion card 30, and further to allow the fluid guiding cover 100 to cover the first expansion card 20 or the second expansion card 30. In other words, the fluid guiding cover 100 has good scalability.

Figure 4A:
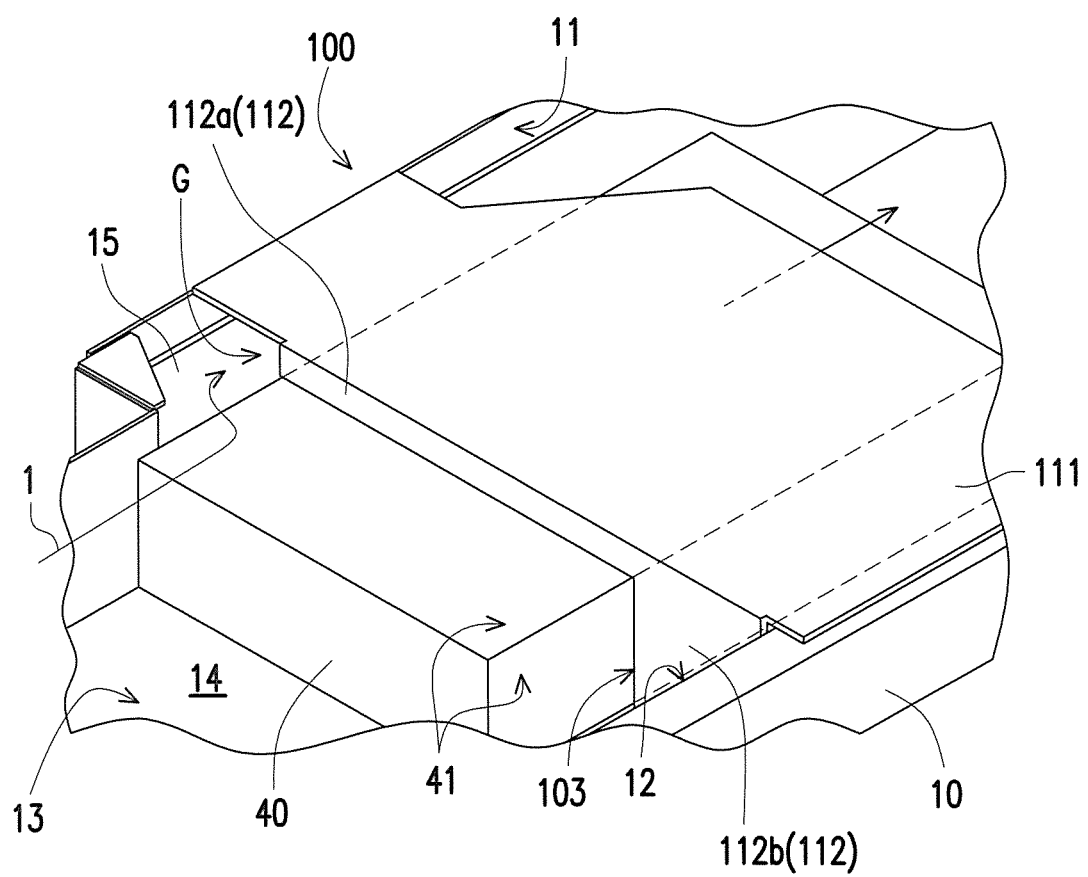
FIG. 4A is a schematic view showing that the fluid guiding cover in FIG. 1A is fitted with a third expansion card.
Figure 4B:
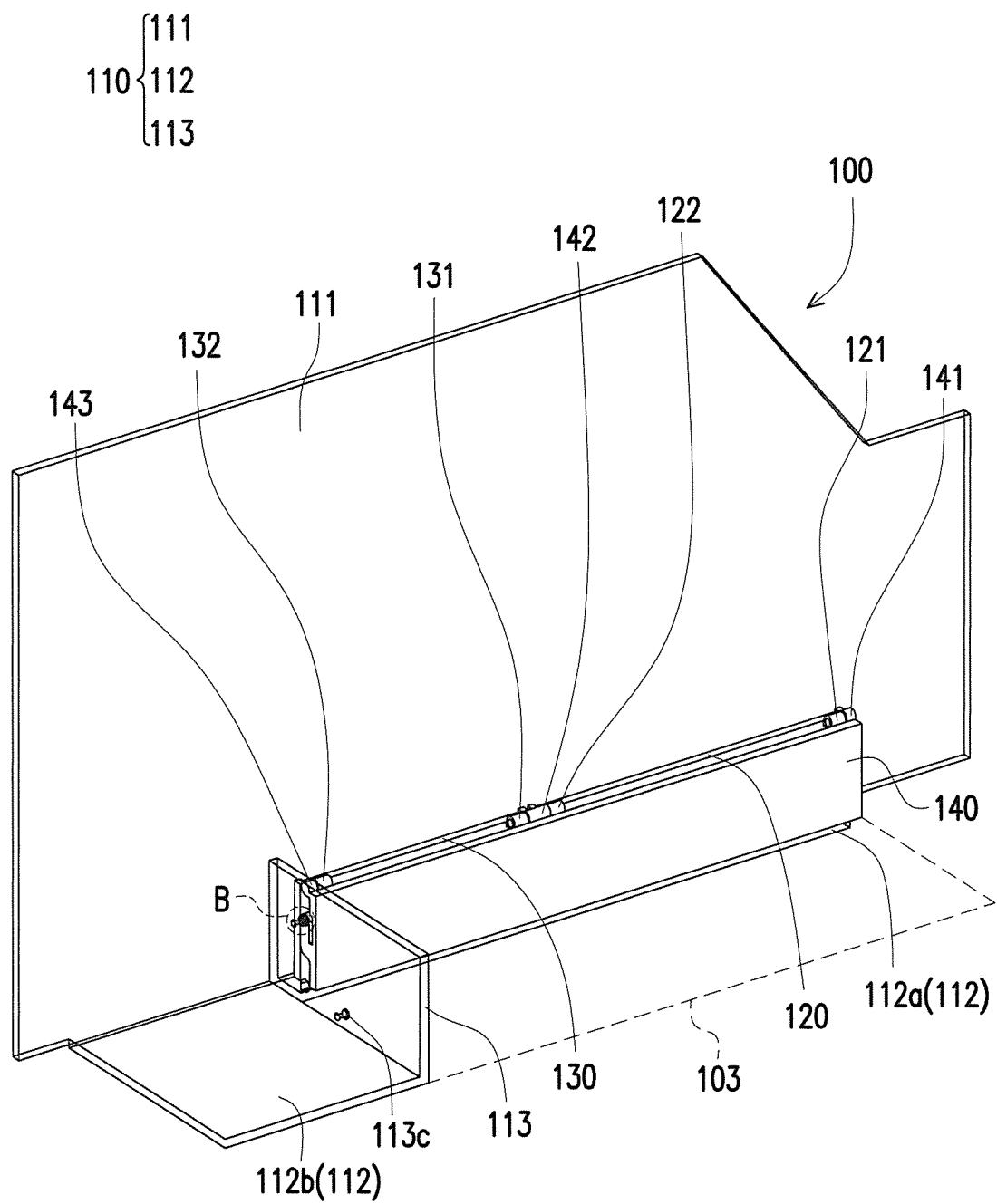
FIG. 4B is a schematic view of the fluid guiding cover in FIG. 4A from another viewing angle.
Figure 4C:
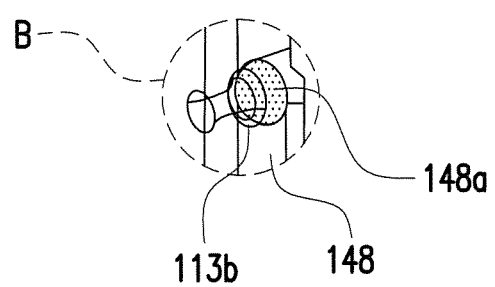
FIG. 4C is an enlarged schematic view of region B in FIG. 4B.

FIG. 4A is a schematic view showing that the fluid guiding cover in FIG. 1A is fitted with a third expansion card. FIG. 4B is a schematic view of the fluid guiding cover in FIG. 4A from another viewing angle. FIG. 4C is an enlarged schematic view of region B in FIG. 4B. For clear illustration and ease of explanation, the first plate 110 in FIG. 4B is illustrated in a perspective manner. Following the above, referring to FIGS. 4A to 4C, a third expansion card 40 (e.g., double wide GPU card) has a larger size than the second expansion card 30 in FIG. 3A, wherein a height of the third expansion card 40 is larger than the height of the second expansion card 30, and a width of the third expansion card 40 is, for example, equal to the width of the second expansion card 30. Thus, after the third expansion card 40 is placed into the channel 14, inserted into the connection port 16 and has abutted against the bottom surface 13 of the casing 10, it is necessary to further rotate the fourth plate 140 relative to the sidewall portion 112 and the extension portion 113 so as to make the fourth plate 140 as well as the second plate 120 and the third plate 130 that overlap the fourth plate 140 respectively parallel to the main body portion 111. During the rotation of the fourth plate 140 relative to the sidewall portion 112 and the extension portion 113, the positioning protrusion 148a of the fifth engagement structure 148 separates from the seventh engagement structure 113c (e.g., a positioning hole), and engages with the sixth engagement structure 113b (e.g., a positioning hole) when the fourth plate 140 is parallel to the main body portion 111. Further, a third opening 103 is defined by the first part 112a and the second part 112b of the sidewall portion 112, wherein an area of the third opening 103 is larger than an area of the second opening 102.

Next, the third opening 103 is directed toward the channel 14, and the main body portion 111 is fixed on the casing 10. At this moment, the main body portion 111 stretches over the third expansion card 40, the second plate 120 and the third plate 130 respectively separate from the bottom surface 13 of the casing 10 and are parallel to the main body portion 111, and the second part 112b of the sidewall portion 112 abuts against the bottom surface 13 of the casing 10. On the other hand, the third expansion card 40 has a cross section perpendicular to the bottom surface 13 of the casing 10, and an area of the cross section is substantially equal to an area of the third opening 103. Thus, after the main body portion 111 is fixed on the casing 10, the third expansion card 40 can be accommodated in the third opening 103, and the sidewall portion 112 abuts against an outer surface 41 of the third expansion card 40, so that the fluid guiding cover 100 covers the third expansion card 40.

In this way, the airflow 1 that passes through the channel 14 is obstructed by the sidewall portion 112, and thus flows from one side of the fluid guiding cover 100 through the gap G into between the main body portion 111 and the third expansion card 40, and flows out from another side of the fluid guiding cover 100. In detail, cold air that flows from one side of the fluid guiding cover 100 through the gap G into between the main body portion 111 and the third expansion card 40 is heat-exchanged with the third expansion card 40 in operation to be converted into hot air, wherein the hot air flows out from another side of the fluid guiding cover 100, so as to dissipate heat generated during operation of the third expansion card 40 to the outside. That is, the disposition of the fluid guiding cover 100 is helpful in improving heat dissipation efficiency of the server.

In summary, the fluid guiding cover according to the invention includes the second plate, the third plate and the fourth plate that are capable of being rotated relative to the first plate, wherein the second plate and the third plate are indirectly connected to the first plate through the fourth plate, and the second plate and the third plate are capable of being rotated relative to the fourth plate. Therefore, by expanding or folding the second plate, the third plate and the fourth plate, the fluid guiding cover can be fitted with the channel of the casing or the expansion cards of three different sizes located in the channel of the casing. Hence, the fluid guiding cover according to the invention has good scalability and is quite easy for a user to operate. On the other hand, from a manufacturer's point of view, since the manufacturer may produce a modular fluid guiding cover corresponding to the expansion cards of three different sizes, the manufacturing cost is reduced, and management and selling are facilitated.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A fluid guiding cover adapted to be assembled to a casing, the fluid guiding cover comprising:
    a first plate, having a main body portion and a sidewall portion, wherein the main body portion is detachably fixed on the casing and stretches over a channel of the casing, and the sidewall portion is connected to the main body portion and located in the channel;
    a second plate, rotatably disposed on one side of the sidewall portion, wherein the second plate is located in the channel and configured to abut against or separate from a bottom surface of the casing, and the sidewall portion at least abuts against the bottom surface of the casing; and
    a third plate, rotatably disposed on one side of the sidewall portion and is disposed in parallel with the second plate, wherein the third plate is located in the channel and configured to abut against or separate from the bottom surface of the casing.

2. The fluid guiding cover according to claim 1, further comprising:
    a fourth plate, rotatably connected to the sidewall portion and located in the channel, wherein the second plate is rotatably connected to the fourth plate, and the third plate is rotatably connected to the fourth plate.

3. The fluid guiding cover according to claim 2, wherein the fourth plate is located between the second plate and the sidewall portion and between the third plate and the sidewall portion.

4. The fluid guiding cover according to claim 2, wherein the second plate and the third plate are respectively located between the fourth plate and the bottom surface of the casing.

5. The fluid guiding cover according to claim 2, wherein the fourth plate is perpendicular to the main body portion.

6. The fluid guiding cover according to claim 2, wherein the second plate has a first engagement structure, and the fourth plate has a second engagement structure disposed corresponding to the first engagement structure, wherein when the second plate is rotated relative to the fourth plate to make the second plate and the fourth plate overlap with each other, the second plate and the fourth plate are perpendicular to the main body portion, the first engagement structure and the second engagement structure are engaged with each other, and the third plate and the fourth plate define a first opening.

7. The fluid guiding cover according to claim 6, wherein the third plate has a third engagement structure, and the fourth plate further has a fourth engagement structure disposed corresponding to the third engagement structure, wherein when the third plate is rotated relative to the fourth plate to make the third plate and the fourth plate overlap with each other, the third plate and the fourth plate are perpendicular to the main body portion, the third engagement structure and the fourth engagement structure are engaged with each other, and the sidewall portion and the fourth plate define a second opening.

8. The fluid guiding cover according to claim 7, wherein an area of the second opening is larger than an area of the first opening.

9. The fluid guiding cover according to claim 7, wherein the fourth plate further has a fifth engagement structure, the first plate further has an extension portion connected to the main body portion and the sidewall portion, and the extension portion is located on one side of the fourth plate and has a sixth engagement structure disposed corresponding to the fifth engagement structure, wherein when the fourth plate is rotated relative to the sidewall portion to make the second plate, the third plate and the fourth plate parallel to the main body portion, the fifth engagement structure and the sixth engagement structure are engaged with each other, and the sidewall portion defines a third opening.

10. The fluid guiding cover according to claim 9, wherein an area of the third opening is larger than an area of the second opening.

11. The fluid guiding cover according to claim 9, wherein the extension portion is perpendicular to the main body portion, and the third plate is located between the extension portion and the second plate.

12. The fluid guiding cover according to claim 9, wherein the fifth engagement structure comprises a positioning protrusion, and the sixth engagement structure is a positioning hole.

13. The fluid guiding cover according to claim 1, wherein the sidewall portion, the second plate and the third plate are respectively perpendicular to the main body portion.

* * * * *